United States Patent
Yanagisawa

(10) Patent No.: US 7,763,484 B2
(45) Date of Patent: Jul. 27, 2010

(54) METHOD TO FORM AN OPTICAL GRATING AND TO FORM A DISTRIBUTED FEEDBACK LASER DIODE WITH THE OPTICAL GRATING

(75) Inventor: Masaki Yanagisawa, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 140 days.

(21) Appl. No.: 12/155,677

(22) Filed: Jun. 6, 2008

(65) Prior Publication Data
US 2009/0023238 A1 Jan. 22, 2009

(30) Foreign Application Priority Data
Jun. 13, 2007 (JP) ............... 2007-156652

(51) Int. Cl.
*H01L 21/00* (2006.01)
(52) U.S. Cl. ............ 438/32; 257/98; 257/E21.002; 264/2.5
(58) Field of Classification Search ........... 438/32; 257/98, E21.002; 264/2.5
See application file for complete search history.

(56) References Cited

U.S. PATENT DOCUMENTS

| | | | |
|---|---|---|---|
| 6,410,416 B1 * | 6/2002 | Dodabalapur et al. ....... | 438/615 |
| 7,165,957 B2 | 1/2007 | Montelius et al. | |
| 7,474,683 B2 * | 1/2009 | Nakabayashi ............ | 372/50.11 |
| 2001/0038102 A1 * | 11/2001 | Kawase ................ | 257/98 |
| 2003/0006527 A1 * | 1/2003 | Rabolt et al. .............. | 264/220 |
| 2005/0052583 A1 * | 3/2005 | Kim ..................... | 349/43 |
| 2006/0251856 A1 * | 11/2006 | McCoy et al. ............ | 428/131 |
| 2008/0000373 A1 * | 1/2008 | Petrucci-Samija et al. ................ | 101/401.1 |
| 2008/0131692 A1 * | 6/2008 | Rolland et al. ............ | 428/336 |

OTHER PUBLICATIONS

"Organic solid-state lasers with imprinted gratings on plastic substrates"; Berggren et al.; Appl. Phys. Lett 72 (4); Jan. 26, 1998; pp. 410-411.
"Embossed grating lead chalcogenide distributed-feedback lasers"; Schlereth et al.; J. Vac. Sci. Technol. B 10 (1), Jan./Feb. 1992; pp. 114-117.
"Nanoimprint lithography", Chou et al.; J. Vac. Sci. Technol. B 14 (6), Nov./Dec. 1996; pp. 4129-4133.

* cited by examiner

*Primary Examiner*—Tuan N. Quach
(74) *Attorney, Agent, or Firm*—Smith, Cambrell & Russell, LLP

(57) ABSTRACT

A method for forming a grating with an adjustable pitch and a method for forming a DFB-LD with an optical grating whose pitch is adjustable during the process are disclosed. The method of the invention; first prepares a mold with a pattern to form the grating; second, pushes the mold against the resin as deforming the mold; and third, hardens the mold. The resin with a periodic pattern whose pitch is adjustable during the process is available.

11 Claims, 4 Drawing Sheets

METHOD TO FORM AN OPTICAL GRATING AND TO FORM A DISTRIBUTED FEEDBACK LASER DIODE WITH THE OPTICAL GRATING

BACKGROUND OF THE INVENTION

1. Field of the Invention

The present invention relates to a method to form an optical grating and to form a distributed feedback laser diode providing the optical grating.

2. Related Prior Art

It is well known in the field of the semiconductor process that, what is called as the nano-imprint technique, pushing a silica mold with a predetermined pattern on a resin; this pattern may be transcribed on the resin. The United States patent, U.S. Pat. No. 7,165,957 has disclosed such nano-imprint technique.

In the conventional nano-imprint technique, one mold with a specific periodic pattern transcribes its pattern on the surface of the resin, that is, the mold may determine only one pattern. When semiconductor devices are necessary to provide their specific patterns, in particular, when the devices provide gratings with pitches specific to independent devices, the number of molds equal to the number of devices is necessary to be prepared.

The present invention is to solve the subject above, that is, one mold of the nano-imprint method is applicable to only one device, the mold according to the present invention is adjustable in the pitch thereof for various devices with a grating specific to the device.

SUMMARY OF THE INVENTION

The method according to the present invention has a feature that (a) preparing a mold made of elastic material and having a periodic pattern to form the optical grating; (b) pushing the mold against a resin as the mold is deformed; and (c) hardening the resin as the mold is pushed thereto. Because the mold is made of elastic material, the mold may be easily deformed, namely, extended or compressed, which may vary the pitch of the periodic pattern formed on the surface of the mold.

The method of the invention may press, when the mold is pushed against the resin, a surface of the mold opposite to a surface where the periodic pattern is formed and faces the resin. This technique may suppress an excess deformation of the mold due to the bend thereof, which may control the pitch of the periodic pattern precisely.

In the method of the invention, the resin is an ultraviolet curable resin, and the step to harden the resin may be performed to irradiate the ultraviolet rays through the mold when the mold is transparent to the ultraviolet rays, or to irradiate the ultraviolet rays through a substrate on which the resin is coated when the substrate is transparent to the ultraviolet rays.

Moreover, in the method of the present invention, the mold may be made of material selected from synthetic rubber, silicon rubber and thermo-elastic elastomer, while, the substrate may be made of silicon (Si).

Another feature of the present invention relates to a method to form a distributed feedback laser diode (DFB-LD) with an optical grating. The method comprising steps of: (a) growing a stack of semiconductor layers on a semiconductor substrate, a top of the stack providing an optical grating layer; (b) forming a periodic pattern made of resin on the optical grating layer, which includes steps of: coating a resin on the optical grating layer, pushing a mold made of elastic material against the resin as the mold is deformed, and hardening the resin as the mold is pushed thereto; (c) etching the optical grating layer by the periodic pattern of the resin as an etching mask to form a periodic pattern in the optical grating layer; and burying this periodic pattern in the optical grating layer by growing another semiconductor layer.

The method to form the DFB-LD of the present invention, because the mold is made of elastic material, the periodic pattern of the resin formed on the optical grating layer may vary the pitch thereof by pushing the mold against the resin as the mold is deformed. Therefore, the DFB-LDs each having the optical grating with a pitch specific to respective devices may be easily formed through only one mold.

DESCRIPTION OF PREFERRED EMBODIMENTS

Next, preferred embodiments of the present invention will be described as referring to accompanying drawings. In the description of drawings, the same numerals or symbols will refer to the same elements without overlapping explanations.

Method to Form a Grating

FIGS. 1A to 2C schematically illustrate the process to form the optical grating according to an embodiment of the invention.

(Preparation of Mold)

Figure 1A:
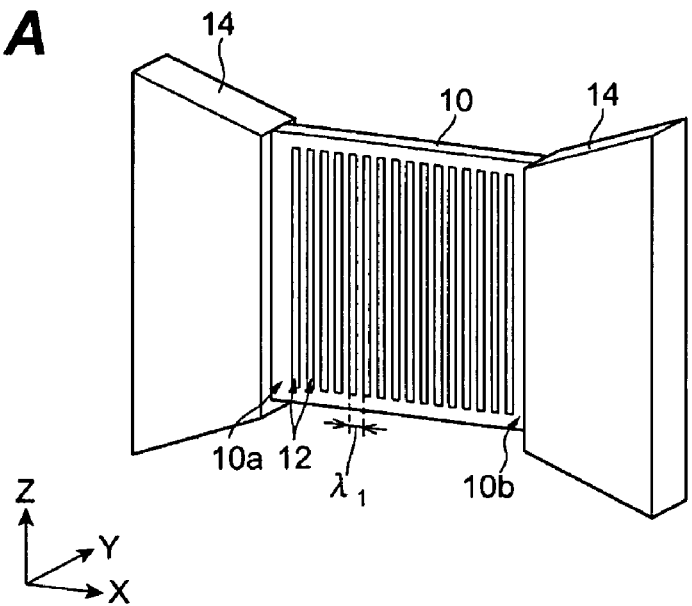
FIGS. 1A and 1B schematically illustrate a process to form a mold for the nano-imprint technique.

First, the mold 10 made of elastic material is prepared as shown in FIG. 1A. The mold 10 with a slab shape has a periodic pattern 12 transcribed to the grating. This pattern 12 includes a plurality of ribs each extending along the direction Z and respective ribs are periodically arranged along the direction X by a pitch of $\lambda_1$. In each side, 10a and 10b, of the mold 10 provides a support 14 to hold the mold 10. Although FIG. 1A shows a ribbed pattern, the pattern may have a grooved shape. When the pattern 12 is the ribbed pattern, the pattern 12 may be made of different material from that of the base, that is, the mold 10 comprises the base and the periodic ribbed pattern 12 made of material different from that of the base.

The elastic material for the mold may be a rubber such as synthetic rubber, silicone rubber, or fluorine containing rubber. A styrene rubber (SBR), a nitrile rubber (NBR) or a neoprene rubber (CR) are well know as the synthetic rubber, while, a poly-dimethyle-siloxane rubber (PDMS) is known as the silicone rubber. The mold may be made of thermoplastic elastomer (TPE), for instance, styrene type elastomer (SBC) and olefin type elastomer (TPO).

The Young's modulus of the material of the base may be 1.5 to 5.0 MPa at a room temperature. Additives, its material and amount, and the composition of the material of the base may adjust the Young's modulus. The mold may be formed by one of processes exemplarily listed below.

(1) Electron Beam Exposure

Coating a photo-resist for the electron beam exposure on the base 10, an electron beam directly draws the patterns above on the photo-resist. Developing the resist and etching the base by the resist as the etching mask, the mold 10 with the periodic pattern may be obtained.

(2) Optical Lithography

Coating a photo-resist for the excimer laser light on the base 10, the excimer laser light, for instance, emitted from the KrF laser, is processed on the resist. Developing the resist and etching the base 10 by the resist as the etching mask, the mold 10 with the grating pattern may be obtained.

(3) Nano-imprint

A mold made of silicon (Si) with the periodic pattern is firstly formed by the method of the electron beam exposure or the optical lithography described above. Coating a thermoplastic resin, for instance, poly-methyl methacrylate (PMMA), on the base of the mold 10, this coated PMMA is thermally processed at a temperature over the glass transition point of the thermo-plastic resin. In the case of PMMA, because the glass transition temperature is 105° C., the process raises its temperature to, for instance, 120° C. Imprinting the Si mold on the softened plastic resin at the processing temperature above mentioned, decreasing the temperature down to a room temperature as pressing the Si mold on the plastic resin, and detaching the mold from the resin at the room temperature, the ribbed pattern of the plastic resin may be imprinted on the base.

(4) Soft Lithography

A mold made of silicon with the periodic pattern is formed by the method similar to that in the nano-imprint method. Coating an elastic material, such as synthetic rubber like PDMS that constitutes the mold 10, on the Si mold, hardening this coated material and detaching from the Si mold, we can obtain the mold 10 made of synthetic rubber shown in FIG. 1A.

(Deforming the Mold)

Figure 1B:
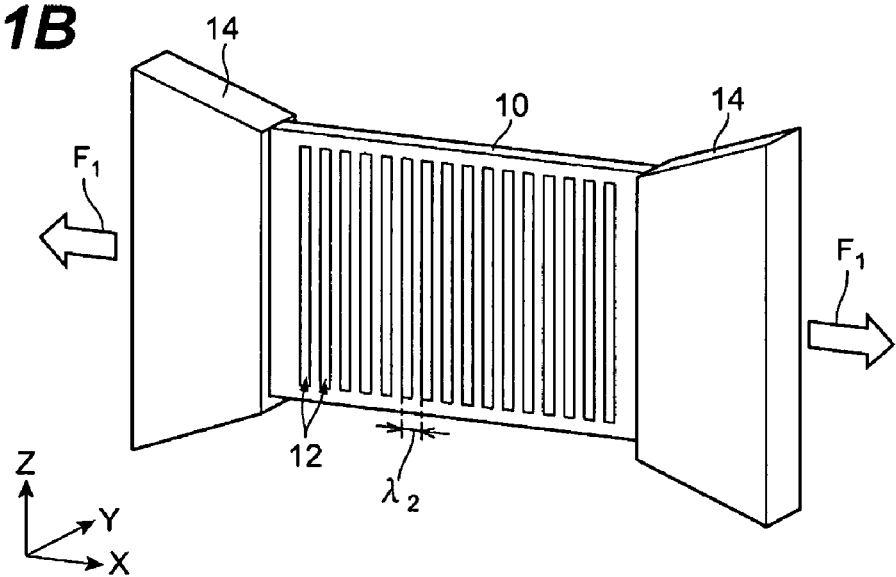

As illustrated in FIG. 1B, the mold 10 is expanded in the direction X by applying a force $F_1$ with the support 14, which changes the pitch of the periodic pattern from $\lambda_1$ to $\lambda_2$ wider than the $\lambda_1$. Practically, by chucking the support 14 with a cramp that is attached with a stepping motor through a screw bar and operating this stepping motor, the mold 10 may be expanded along the X-direction with a force brought by the rotation of the screw bar. Estimating the deformation of the mold 10 required from the target grating depending on the practical pitch of the ribbed pattern on the mold 10 and determining the number of the pulses sent to the stepping motor based on this evaluation, the deformation of the mold may be precisely controlled. In this process, the mold 10 may be compressed in the direction X within the limit of no crumples formed on the periodic patterns. Also, the mold 10 may be expanded and compressed along the Z direction.

In an example, the mold 10 has a slab shape of 60 mm square and 1 mm thickness, and this mold 10 made of silicone rubber shows the Young's modulus of 5.0 MPa. Assuming the mold 10 is deformed by 11%, the strain σ necessary to deform the mold 10 may be estimated as; σ=0.11×5.0 [MPa]=0.55 [MPa], and the external force $F_1$ to be applied to the mold 10 becomes;

$$F_1=0.55 \text{ [MPa]} \times 60 \text{ [mm}^2\text{]}=33 \text{ [N]},$$

which is easily available by the mechanism above described with the stepping motor.

(Imprinting the Mold)

Figure 2A:
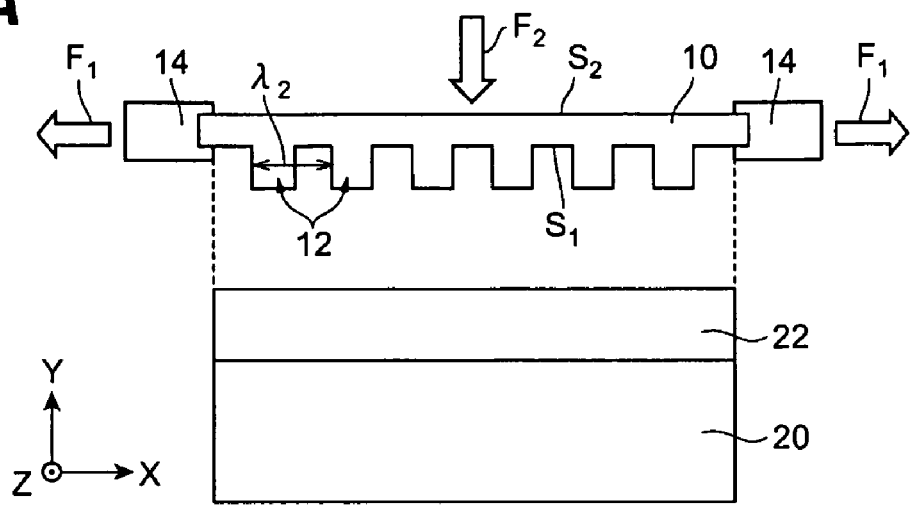
FIGS. 2A to 2C schematically illustrate a process to form a grating on the substrate using the mold shown in FIGS. 1A and 1B.
Figure 2B:
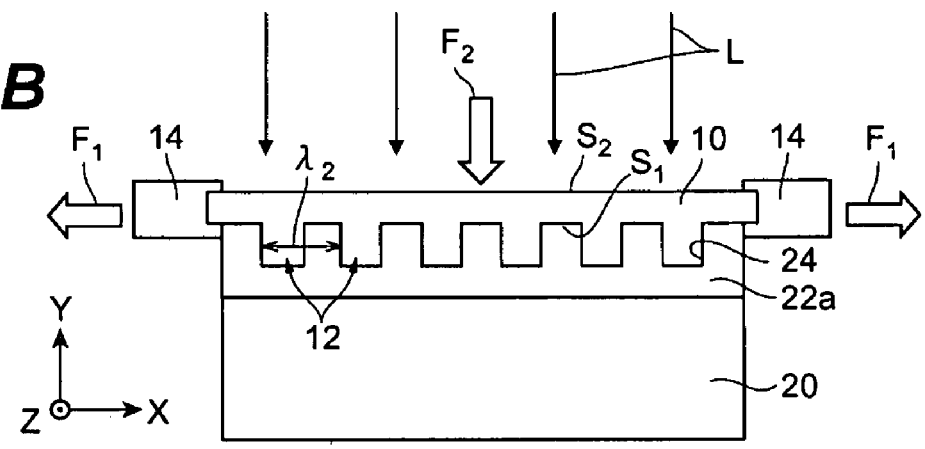

Next, the ribbed pattern 12 on the mold 10 is imprinted on the resin 22 as the mold is deformed, as illustrated in FIG. 2A, where the resin 22 is coated on the substrate 20. It is preferable to press the surface $S_2$ of the mold 10 opposite to the surface $S_1$ providing the ribbed pattern 12 with an external force $F_2$. When the resin 22 shows the viscosity of about 0.9 mPa·s, which is comparable to that of water, the pressure to be applied on the mold 10 may be smaller than 0.1 MPa. While, the resin has the viscosity of over 10 mPa·s, it is sometimes necessary to push the mold 10 by a pressure over 10 MPa to precisely transcript the ribbed pattern of the mold 10 on the resin 22. In such a case, the mold 10 occasionally bends along the Y-direction because the mold 10 is made of elastic material. So, it is preferable to provide a mechanism to push the surface $S_2$ of the mold 10 toward the substrate. Pressing the surface $S_2$ with the air, the liquid like water or the solid like a silica plate may be applicable. In the case of the air-pushing, an air chamber is preferably arranged in the side of the surface $S_2$ to form the positive pressure in the $S_2$ side compared to the $S_1$ side, or a balloon blew up with the air may be provided in the $S_2$ side.

(Hardening)

Subsequently, the resin 22 is hardened as the pattern 12 is pushed against the resin 22, which forms the periodic pattern 24 in the resin 22a. The pitch of the periodic pattern 24 follows the pitch $\lambda_2$ on the mold 10. The hardening of the resin 22 may be carried out by the irradiation of the ultraviolet rays (UV nano-imprint) or the thermal treatment (Thermal nano-imprint). Moreover, it is preferable to continuously press the surface $S_2$ with the external force $F_2$ during the hardening of the resin 22.

In the UV nano-imprint method, the resin is necessary to be made of ultraviolet hardened resin, and the mold 10 is necessary to be transparent for the ultraviolet rays L when the ultraviolet rays is irradiated from the side of the mold 10, while, the substrate 20 is necessary to be transparent for the rays L when the rays is irradiated from the side of the substrate 20. A silica glass is transparent for the ultraviolet rays.

In the thermal nano-print method, the resin may be a thermo-plastic resin such as PMMA described above or thermosetting resin such as polyurethane (PUR).

(Detaching Mold)

Figure 2C:
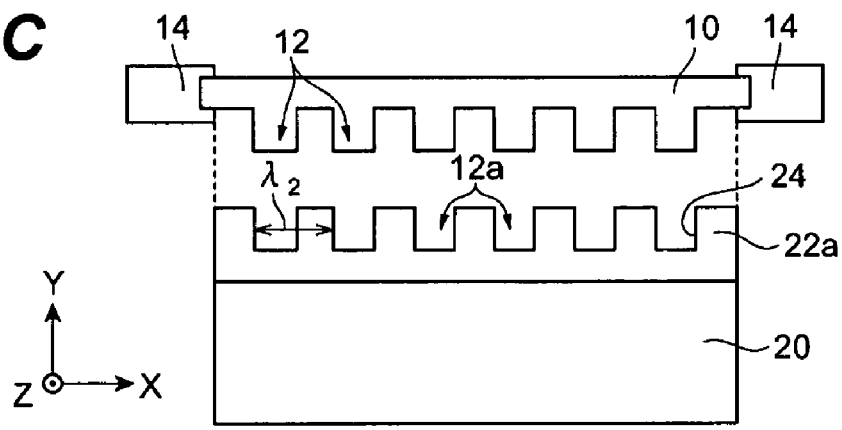

Next, the process detaches the mold 10 from the hardened resin 22a as illustrated in FIG. 2C. Thus, the grating 24 with the grooves 12a, or ribs between the grooves, extending along the direction X is formed on the substrate 20. The groove 12a reflects the ribbed pattern 12 on the mold 10. The groove 12a has a depth of 0.05 to 0.5 μm with a remainder thickness of 0.01 to 0.2 μm in the bottom of the groove. In order to form the optical grating in the substrate, the dry-etching is performed for the whole hardened resin 22a without any etching mask until the substrate 20 is exposed in the bottom of the groove 12a and another etching of the exposed substrate 20 is further carried out by the hardened resin 22a as the etching mask.

Because the method to form the grating according to the present embodiment described above uses the mold 10 made of elastic material, the pitch $\lambda_2$ formed on the resin 22a may be adjustable by expanding or compressing the mold 10 along the direction X. Thus, not only a desirable pitch is available but a plurality of gratings each having the pitch different from each other is obtainable with the single mold 10.

Moreover, when the ribbed pattern 12 on the mold 10 is pressed against the resin 12, the surface $S_2$ of the mold 10 is pressed, which suppresses an excess deformation of the mold 10 along the direction Y when the mold 10 probably bends without any force applied on the surface $S_2$, and may maintain the pitch $\lambda_2$ in a preset dimension.

Method to Form a Distributed Feedback Laser Diode

Figure 3A:
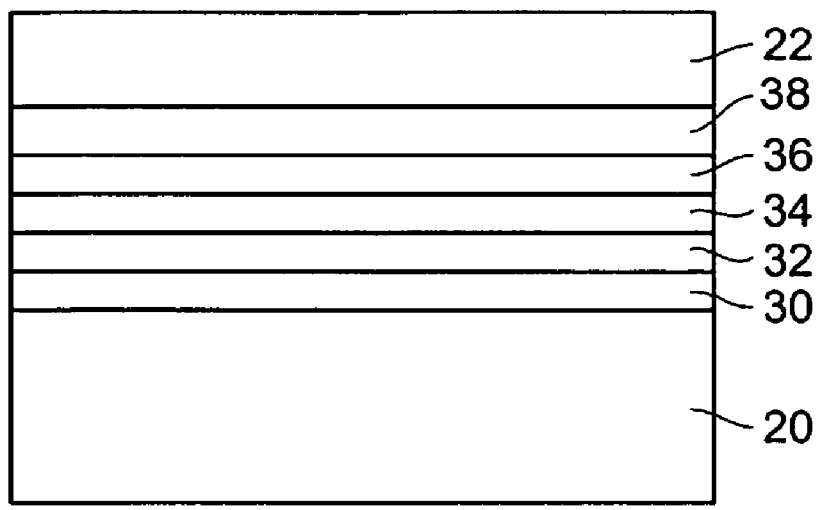
FIGS. 3A and 3B schematically illustrate a process to form a distributed feedback laser diode using the mold formed by the process shown in FIGS. from 1A to 2C.
Figure 3B:
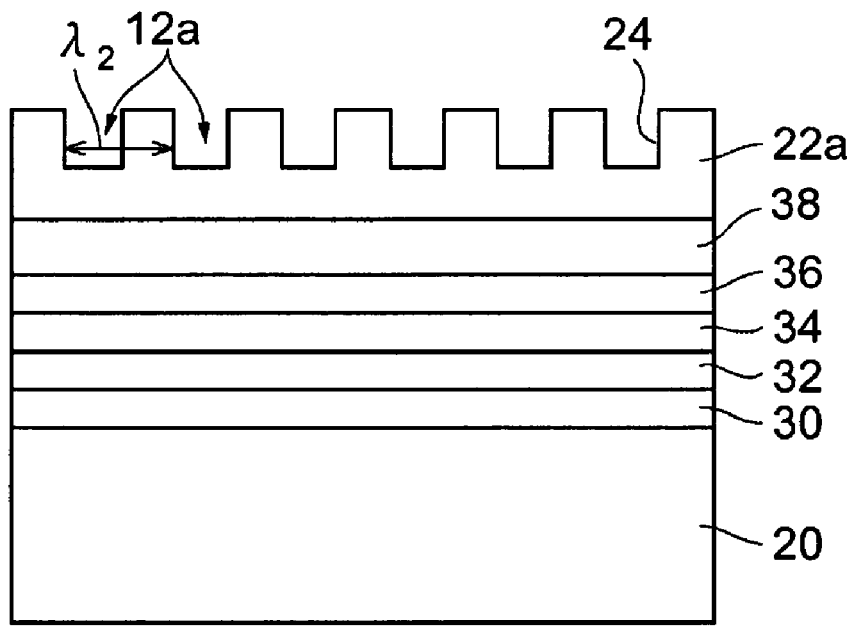
Figure 4:
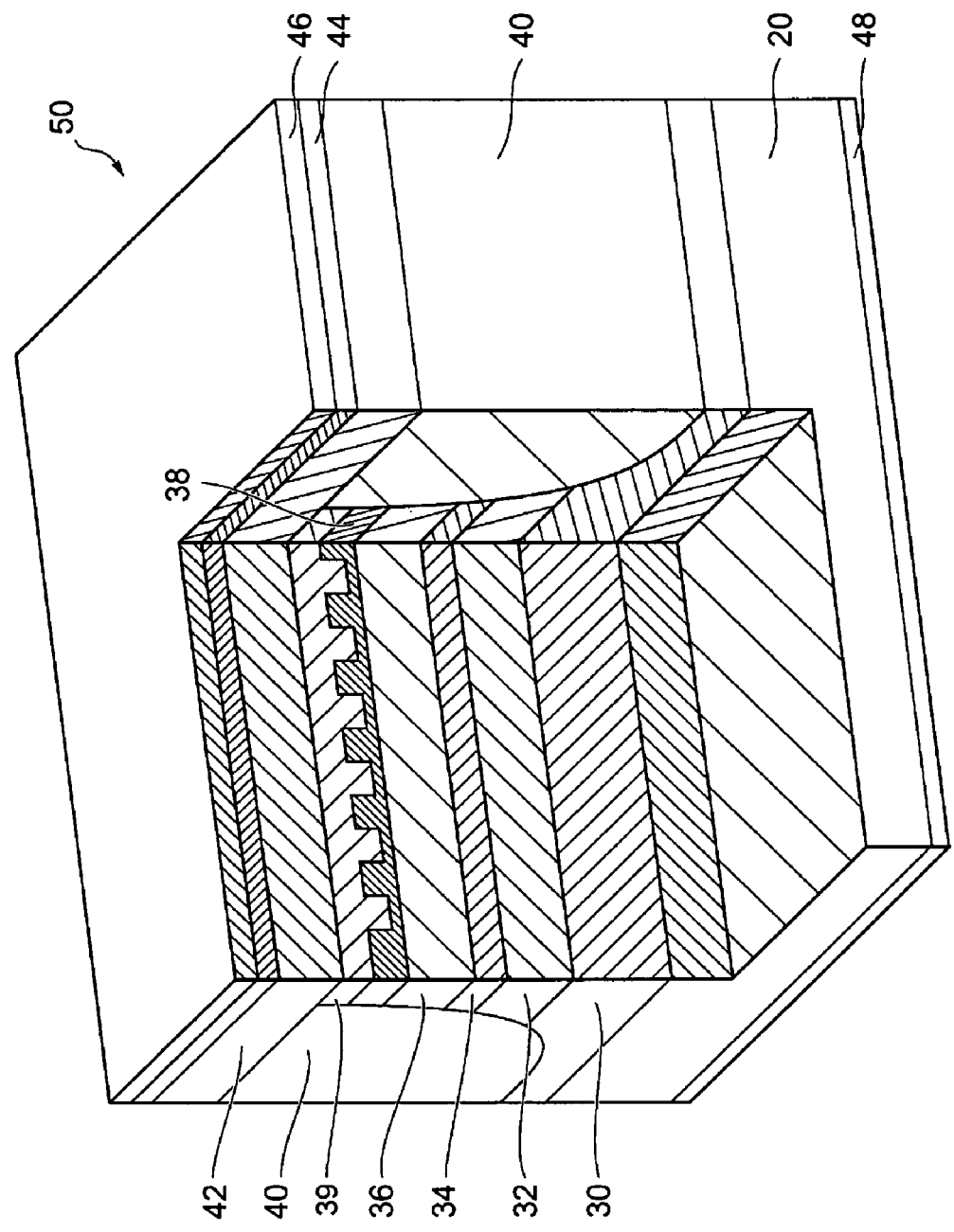
FIG. 4 is a partially broken perspective drawing of the distributed feedback laser diode formed by the process shown in FIGS. 3A and 3B.

FIGS. 3A and 3B schematically illustrate a process to form a distributed feedback laser diode (hereafter denoted as DFB-LD) according to an embodiment of the invention. FIG. 4 is a partially broken perspective view of the DFB-LD formed by the process shown in FIGS. 3A and 3B. Next, the process will be described.

(Formation of Resin)

A stacked layer including: a first cladding layer 30 of an n-type InP, a first optical confinement layer 32 of an n-type GaInAsP, an active layer 34 with the multi-quantum well (MQW) structure including an un-doped GaInAsP as well layers and another un-doped GaInAsP with a composition different from that of the well layers as barrier layers, a second optical confinement layer 36 of a p-type GaAsInP and an optical grating layer 38 of a p-type GaInAsP; is firstly formed on the n-type InP substrate 20. Secondly, a resin 22 is coated on the stacked layer. In a modification of the layers, the stacked layer may omit two optical confinement layers, 32 and 36.

Next, the grating pattern 24 is formed in the hardened resin 22a by pressing the periodic ribbed pattern 12 against the resin 22, which is described previously. Subsequent etching of the whole hardened resin 22a partially exposes the top semiconductor layer 38, the optical grating layer 38, in the bottom of the groove in the hardened resin 22a and further etching of this partially exposed top semiconductor layer, the optical grating layer 38, by the hardened resin 22a as the etching mask may form the optical grating.

After removing the patterned resin 22a, the process grows the second cladding layer 39 of a p-type InP on the optical grating layer 38 so as to bury the optical grating layer 38 with the grating pattern formed by the method above described. The layers, 39 to 30, thus formed by the foregoing process are etched to form a semiconductor mesa, and another semiconductor layer 40 of a semi-insulating InP doped with iron (Fe) is grown so as to bury the semiconductor mesa. Finally, on the mesa and the semiconductor layer 40 is grown with the third cladding layer 42. One type of a DFB-LD may omit this third cladding layer 42. A contact layer 44 of a p-type GaInAs and an electrode 46 with a stacked metal of Ti/Pt/Au are formed on the third cladding layer 42, while another electrode 48 with a eutectic metal of AuGe/Ni is formed on the back surface of the substrate 20.

Thus, the DFB-LD 50 may be formed by the process described above. The DFB-LD according to the present invention may provide the grating 24 with a pitch easily adjustable during the process similar to the method to form the grating described above. According to the method of the invention, various DFB-LDs 50 each having different grating pitches are available by using the single mold 10.

Such DFB-LDs are effectively applicable in the CWDM (Course Wavelength Division Multiplexing) system. For instance, when the DFB-LD for the CWDM system in a range of 1.31 μm is formed, the pitch $\lambda_2$ of the grating 24 is preferable adjusted from 195 to 215 nm, while, when the DFB-LD for the 1.55 μm band in the CDWM system, the pitch of the grating is preferably adjusted from 215 to 255 nm. When the mold 10 with the ribbed pattern whose pitch is 195 nm is applied, it is necessary to deform the mold 10 by about 11% to expand the pitch $\lambda_2$ thereof to 215 nm.

Conventionally, it is necessary to prepare several types of DFB-LDs for the CWDM system in the 1.55 μm band, for instance, over 10 types of devices with grating pitches of 222 nm, 226 nm, 230 nm, 234 nm and so on, are necessary to correspond the full wavelengths of the optical signals. In this case, more than 10 types of molds are necessary. Moreover, when we use the EB exposure to prepare the mold with the pitch of 220.0 nm, the practically obtainable pitch of the mold sometimes becomes 222.2 nm due to the drawing accuracy of the EB apparatus. In such a case, we must reform the mold.

On the other hand, the method according to the present invention may adjust the pitch of the mold by deforming the mold even when the pitch originally formed becomes out of the desired value. Thus, the present method makes the reformation of the mold unnecessary, and enhances the yield of the device.

While, the preferred embodiments of the present invention have been described in detail above, many changes to these embodiments may be made without departing from the true scope and teachings of the present invention. The present invention, therefore, is limited only as claimed below and the equivalents thereof.

What is claimed is:

1. A method for forming an optical grating on a substrate, comprising steps of:
    preparing a mold made of elastic material, said mold having a periodic pattern along a direction to form said optical grating;
    pushing said mold against a resin coated on said substrate and deforming said mold along said direction to vary a pitch of said periodic pattern; and
    hardening said resin as said mold is pushed against said resin.

2. The method according to claim 1,
    wherein said step to push said mold against said resin includes a step to press a surface of said mold opposite to a surface facing said resin.

3. The method according to claim 1,
    wherein said resin is curable by ultraviolet rays and said step to harden said resin includes a step of irradiating said ultraviolet rays on said resin.

4. The method according to claim 3,
    wherein said mold is transparent to said ultraviolet rays and said ultraviolet rays are irradiated from a side of said mold.

5. The method according to claim 3,
    wherein said substrate is transparent to said ultraviolet rays and said ultraviolet rays are irradiated from a side of said substrate.

6. The method according to claim 1,
    wherein said mold is made of material selected from synthetic rubber, silicon rubber and thermo-elastic elastomer.

7. The method according to claim 1,
    wherein said substrate is silicon.

8. The method according to claim 1,
    wherein said step to push to deform said mold includes a step to expand said mold by applying a force along said direction.

9. The method according to claim 1,
    wherein said step to deform said mold includes a step to compress said mold by applying a force along said direction.

10. A method to form a distributed feedback laser diode, comprising steps of:
    growing a stack of semiconductor layers on a semiconductor substrate, said stack includes a lower cladding layer, a lower optical confinement layer, an active layer, an upper separate optical confinement layer, and an optical grating layer;

forming a periodic pattern made of resin on said optical grating layer, said step to form said periodic pattern including, coating a resin on said optical grating layer, pushing a mold made of elastic material against said resin as said mold is deformed, and hardening said resin as said mold is pushed thereto;

etching said grating layer by said periodic pattern as an etching mask to form a periodic pattern in said optical grating layer; and burying said periodic pattern in said optical grating layer by growing an upper cladding layer.

11. The method according to claim 10, further comprising, after said step to bury said periodic pattern in said optical grating layer, forming a mesa by partially etching said upper cladding layer, said optical grating layer, said upper separate confinement layer, said active layer, said lower separate optical confinement layer, and said lower cladding layer; and burying said mesa by growing a semiconductor layer.

* * * * *